(12) United States Patent
Beaulieu et al.

(10) Patent No.: US 12,215,423 B2
(45) Date of Patent: Feb. 4, 2025

(54) GAS MANIFOLD FOR SIMULTANEOUS GAS PROPERTY CONTROL IN DEPOSITION SYSTEMS

(71) Applicant: Arradiance, LLC, Littleton, MA (US)

(72) Inventors: David R. Beaulieu, Groton, MA (US); Jeffrey D. McHugh, Maynard, MA (US); Michael D. Trotter, Bolton, MA (US); Darith Kong, Lowell, MA (US)

(73) Assignee: Arradiance, LLC, Littleton, MA (US)

( * ) Notice: Subject to any disclaimer, the term of this patent is extended or adjusted under 35 U.S.C. 154(b) by 105 days.

(21) Appl. No.: 17/682,929

(22) Filed: Feb. 28, 2022

(65) Prior Publication Data
US 2023/0272531 A1 Aug. 31, 2023

(51) Int. Cl.
*C23C 16/455* (2006.01)
*C23C 16/44* (2006.01)
*C23C 16/54* (2006.01)

(52) U.S. Cl.
CPC ...... *C23C 16/4557* (2013.01); *C23C 16/4412* (2013.01); *C23C 16/45544* (2013.01); *C23C 16/45565* (2013.01); *C23C 16/45574* (2013.01); *C23C 16/54* (2013.01)

(58) Field of Classification Search
CPC ............ C23C 16/4557; C23C 16/4412; C23C 16/45544; C23C 16/45565; C23C 16/45574; C23C 16/54; C23C 16/455; C23C 16/45561; C23C 16/52; C23C 16/45563; C23C 16/45568;
(Continued)

(56) References Cited

U.S. PATENT DOCUMENTS

| 7,855,493 B2 | 12/2010 | Sullivan et al. |
| 7,977,617 B2 | 7/2011 | Sullivan et al. |
| 8,134,108 B2 | 3/2012 | Sullivan et al. |

(Continued)

OTHER PUBLICATIONS

Huerta et al., "Phase 3D Printing of Functional Materials", Advanced Materials Technologies, 2000657, 2020, pp. 1-8.
(Continued)

*Primary Examiner* — Aiden Lee
(74) *Attorney, Agent, or Firm* — Rauschenbach Patent Law Group, PLLC; Kurt Rauschenbach

(57) ABSTRACT

A gas manifold includes a gas inlet surface having a first and second gas input port and a gas outlet surface. A first internal chamber is coupled to the first gas input port. A first plurality of gas conduits, each including an input coupled to the first internal chamber and an outlet at the gas outlet surface where a direction of at least one of the conduits in the first plurality of gas conduits relative to the gas outlet surface is different. A second internal chamber is coupled to the second gas input port and is isolated from the first internal chamber. A second plurality of gas conduits, each including an input coupled to the second internal chamber and an outlet at the gas outlet surface. A direction of at least one of the conduits in the second plurality of gas conduits relative to the gas outlet surface is different. Directions of at least some of the gas conduits in the first and second plurality of gas conduits relative to the gas outlet surface can be selected to provide a desired gas flow pattern proximate to the gas outlet surface.

12 Claims, 7 Drawing Sheets

(58) Field of Classification Search
CPC ........ C23C 16/45572; C23C 16/45576; C23C 16/45578

See application file for complete search history.

(56) References Cited

U.S. PATENT DOCUMENTS

| | | | |
|---|---|---|---|
| 8,227,965 B2 | 7/2012 | Sullivan et al. | |
| 8,237,129 B2 | 8/2012 | Sullivan et al. | |
| 8,822,338 B2 * | 9/2014 | Maeng | C23C 16/45574 257/E21.17 |
| 9,064,676 B2 | 6/2015 | Sullivan et al. | |
| 9,368,332 B2 | 6/2016 | Sullivan et al. | |
| 2009/0229524 A1 * | 9/2009 | Kim | C23C 14/243 118/726 |
| 2012/0141674 A1 * | 6/2012 | Park | C23C 14/12 118/726 |
| 2017/0252756 A1 * | 9/2017 | Iizuka | C23C 16/45565 |
| 2018/0212203 A9 * | 7/2018 | Lee | H10K 71/164 |
| 2019/0145002 A1 * | 5/2019 | Um | C23C 16/45557 118/722 |
| 2020/0087777 A1 * | 3/2020 | Nishiguchi | C23C 14/243 |

OTHER PUBLICATIONS

"Superfast plasma-ald with 3D-printed ceramic rocket nozzles", URL: https://www.ikts.fraunhofer.de/en/departments/energy_systems/system_integration_technology_transfer/thin-film_technology/cr_superfast_plasma-ald_with_3d-printed_ceramic_rocket_nozzles.html, Current Research, Fraunhofer IKTS, retrieved on Feb. 18, 2021, 2 pages.

"3D Printed Manifolds in the Automotive Industry", URL: https://www.additiveindustries.com/markets/automotive/manifolds, Additive Industries, retrieved on Feb. 18, 2021, pp. 1-4.

* cited by examiner

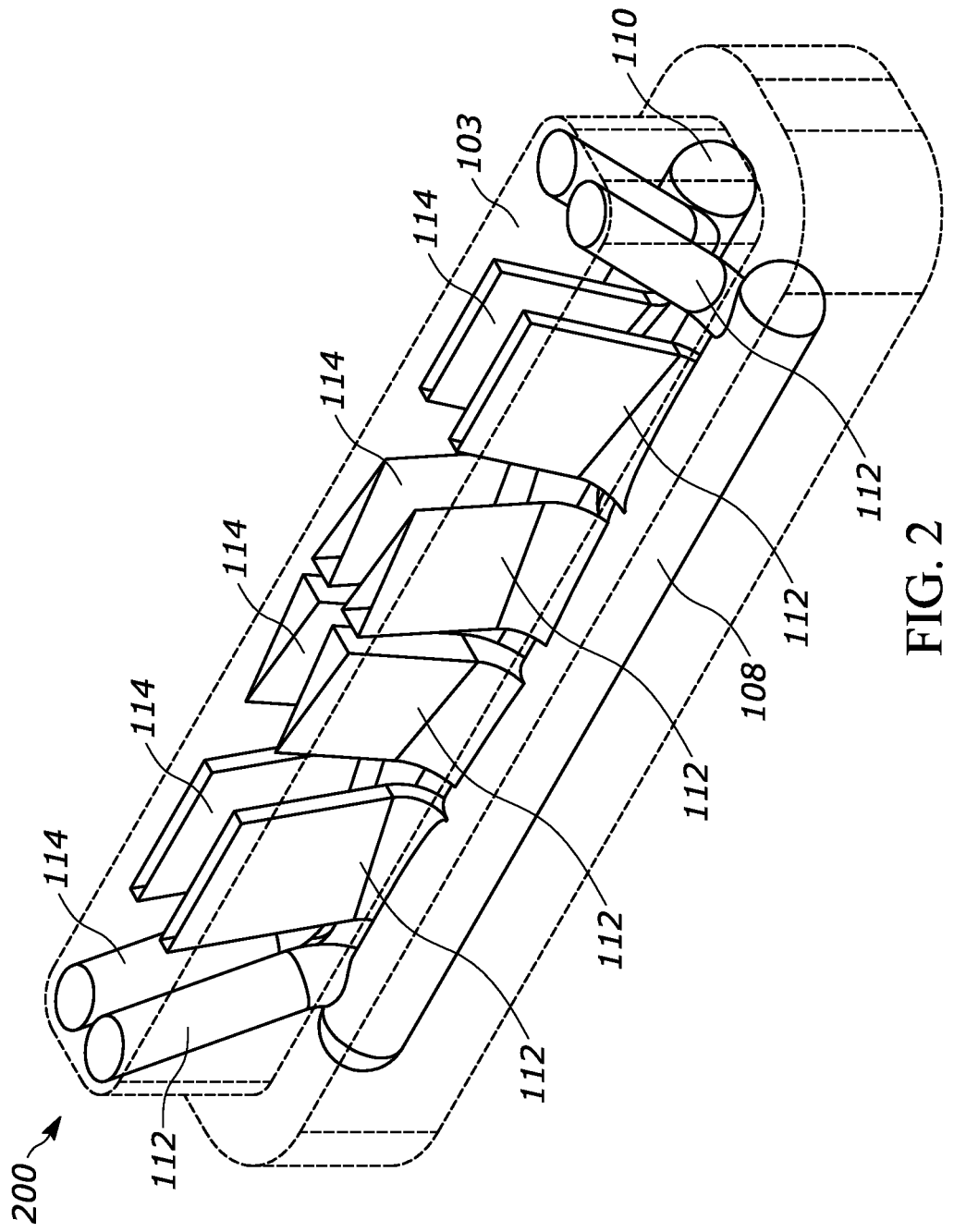

GAS MANIFOLD FOR SIMULTANEOUS GAS PROPERTY CONTROL IN DEPOSITION SYSTEMS

The section headings used herein are for organizational purposes only and should not be construed as limiting the subject matter described in the present application in any way.

INTRODUCTION

Chemical vapor deposition (CVD) involves directing one or more gases containing chemical species onto a surface of a substrate so that the reactive species react and form a film on the surface of the substrate. Materials are typically grown by injecting at least one precursor gas and, in many processes, at least a first and a second precursor gas into a process chamber containing the crystalline substrate. Compound semiconductors, such as III-V semiconductors, can be formed by growing various layers of semiconductor materials on a substrate using precursor gases. Metalorganic vapor phase epitaxy (MOVPE) is a vapor deposition method that is commonly used to grow compound semiconductors using a surface reaction of metalorganics and hydrides containing the required chemical elements.

Atomic Layer Deposition (ALD) is a chemical process used to create custom material coatings often less than a few nanometers in thickness. Atomic layer deposition is a variation of CVD that uses a self-limiting reaction. The term "self-limiting reaction" is defined herein to mean a reaction that limits itself in some way. For example, a self-limiting reaction can limit itself by terminating after a reactant is completely consumed by the reaction or once the reactive sites on the deposition surface have been occupied.

An exemplary cycle of an ALD deposition sequence includes flowing an inert purge gas while pulsing one precursor material to saturate the substrate, then allowing the chamber to purge under vacuum, then pulsing another reactive precursor material to fully saturate the substrate before purging the chamber again under vacuum. The result of performing the ALD deposition sequence is a very consistent deposition thickness that depends upon the precursors being used and their ability to fully react with all chemical species on the surface of the substrate before being fully purged from the chamber. This cycle can be repeated until the desired thickness is achieved, forming a desired single material layer. This cycle can also be alternated with pulsing a third or fourth precursor material while flowing inert purging gas and allowing the substrate to be fully saturated and then purged between pulses. In some methods of the present invention, there does not need to be a reactant gas if the precursor material interacts with the substrate directly. For example, in one embodiment of the present invention, the ALD deposition sequence includes pulsing dopant metal precursor material onto a conducting oxide layer.

Atomic layer deposition has been shown to be effective in producing highly uniform, pinhole-free films having thicknesses that are as thin as a few Angstroms. Films deposited by ALD have relatively high quality and high film integrity compared with other deposition methods, such as physical vapor deposition (PVD), thermal evaporation, and chemical vapor deposition (CVD), especially taking into account large aspect ratios of MCP pores.

Experiments have shown that depositing resistive films by atomic layer deposition (ALD) significantly enhances the performance of some particular devices, such as the microchannel plate devices. See, for example, U.S. Pat. No. 7,855,493, entitled "Microchannel Plate Devices with Multiple Emissive Layers"; U.S. Pat. No. 7,977,617, entitled "Image Intensifying Device", U.S. Pat. No. 8,134,108 entitled "Image Intensifying Device"; U.S. Pat. No. 8,227,965, entitled "Microchannel Plate Devices with Tunable Resistive Films"; U.S. Pat. No. 8,237,129, entitled "Microchannel Plate Devices with Tunable Resistive Films"; U.S. Pat. No. 9,064,676, entitled "Microchannel Plate Devices with Tunable Conductive Films", and U.S. Pat. No. 9,368,332, entitled "Microchannel Plate Devices with Tunable Conductive Films". U.S. Pat. Nos. 7,855,493, 7,977,617, 8,134,108, 8,227,965, 8,237,129, 9,064,676, and 9,368,332 are assigned to the present assignee and are incorporated herein by reference.

In particular, ALD can be used to form nanolayer and nanolaminate materials, which are composite materials that include ultra-thin layers of two or more different materials in a layered stack, where the layers are alternating layers of different materials having a thickness that is on the order of a nanometer or less. Nanolayer and nanolaminate materials may be continuous films that are a single monolayer thick. Nanolayer and nanolaminate materials are formed when the thickness of the first series of cycles results in a layer that is only a few molecular layers thick, and the second series of cycles results in a different layer that is only a few molecular layers thick.

Nanolayer and nanolaminate materials are not limited to alternating single layers of each material. Instead, nanolayer and nanolaminate materials can include several layers of one material alternating with a single layer of the other material that form a desired ratio of the two or more materials. Such an arrangement can achieve a film having a conductivity that varies over a wide range. Nanolayer and nanolaminate materials can also include several layers of one material formed by an ALD reaction either over or under a single layer of a different material formed by another type of reaction, such as a MOCVD reaction. The layers of different materials may remain separate after deposition, or they may react with each other to form an alloy layer. The alloy layer can be a doping layer. Doping the layer can be used to vary the properties of the layer.

Many complex CVD processes, such as ALD processes, may require highly specialized gas manifolds that deliver precursor and process gases to a process chamber with a precise flow pattern, flow rate, and other gas flow properties.

BRIEF DESCRIPTION OF THE DRAWINGS

The present teaching, in accordance with preferred and exemplary embodiments, together with further advantages thereof, is more particularly described in the following detailed description, taken in conjunction with the accompanying drawings. The skilled person in the art will understand that the drawings, described below, are for illustration purposes only. The drawings are not necessarily to scale; emphasis instead generally being placed upon illustrating principles of the teaching. The drawings are not intended to limit the scope of the Applicant's teaching in any way.

FIG. 2 shows a gas manifold 200 according to the present teaching where at least one of the plurality of conduits has a different conduit cross sectional area and/or cross-sectional shape.

DESCRIPTION OF VARIOUS EMBODIMENTS

Figure 1A:
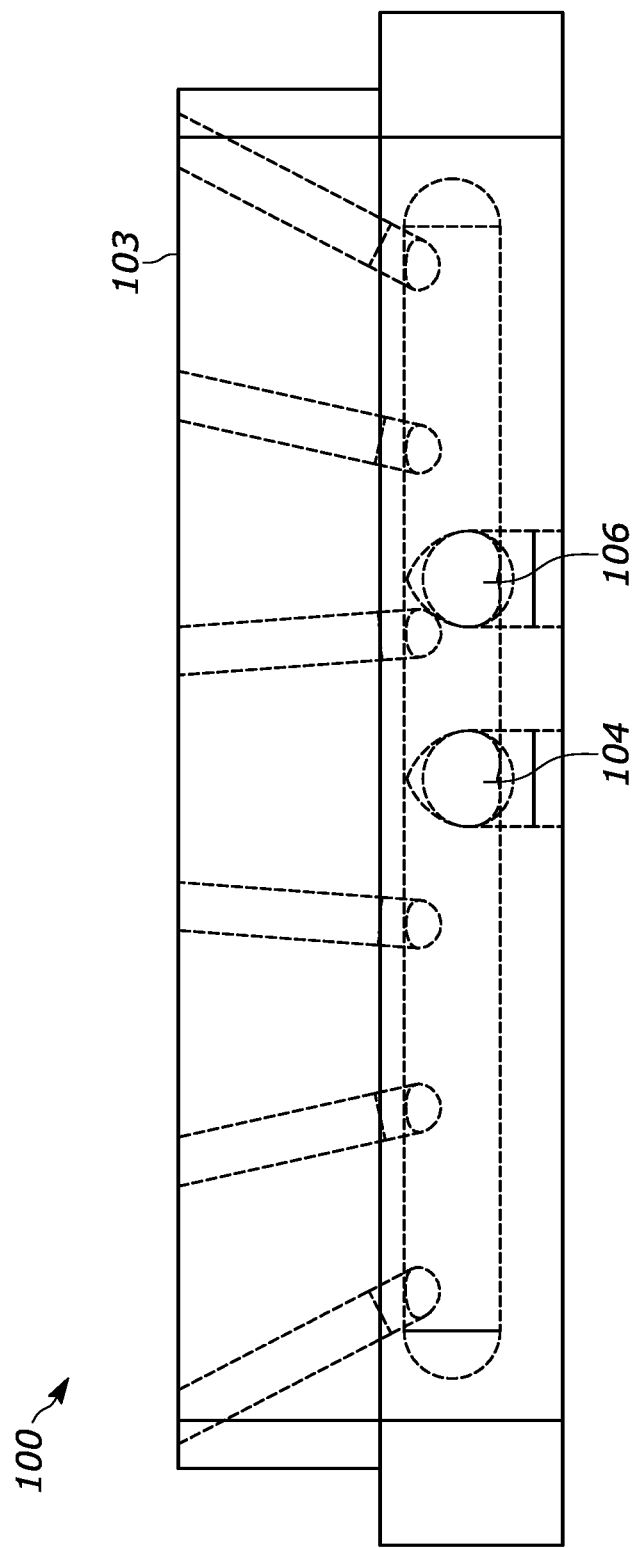
FIG. 1A illustrates a cross-sectional view of a gas manifold according to the present teaching that provides gases from two separate input ports to a plurality of output ports with a precise flow pattern.

The present teaching will now be described in more detail with reference to exemplary embodiments thereof as shown in the accompanying drawings. While the present teachings are described in conjunction with various embodiments and examples, it is not intended that the present teachings be limited to such embodiments. On the contrary, the present teachings encompass various alternatives, modifications and equivalents, as will be appreciated by those of skill in the art. Those of ordinary skill in the art having access to the teaching herein will recognize additional implementations, modifications, and embodiments, as well as other fields of use, which are within the scope of the present disclosure as described herein.

Reference in the specification to "one embodiment" or "an embodiment" means that a particular feature, structure, or characteristic described in connection with the embodiment is included in at least one embodiment of the teaching. The appearances of the phrase "in one embodiment" in various places in the specification are not necessarily all referring to the same embodiment.

It should be understood that the individual steps of the methods of the present teaching can be performed in any order and/or simultaneously as long as the teaching remains operable. Furthermore, it should be understood that the apparatus and methods of the present teaching can include any number or all of the described embodiments as long as the teaching remains operable.

The present teaching relates to highly specialized gas manifolds that deliver precursor and process gases to a process chamber with multiple precise properties controlled simultaneously, such as flow patterns, volumetric flow rates, velocities, temperatures, pressures, gas ionization, and desired molar ratios between two or more mixed gases within the manifold. Each of these gas properties can be individually controlled at one or more localized points proximate to the substrate surfaces, and in this way a 3-dimensional profile of precursor gas properties can be created and controlled within the manifold and reaction chamber. Gas manifolds are essentially pipes that are fed gas from an input gas source to an output. Gas manifolds for various applications can have complex shapes and with many different sections. One aspect of the present teaching is that these highly specialized gas manifolds can be fabricated with three-dimensional printing. Three-dimensional printing is an additive manufacturing process that creates three dimensional objects layer-by-layer using a computer created design. It should be understood that the three-dimensional printing can be used to print these manifolds from numerous types of materials, such as metal, ceramic, and plastic.

Three-dimensional metal printing techniques have many benefits in that they can be used to fabricate gas manifolds with shapes and dimension that are difficult or impossible to fabricate using conventional machining techniques and equipment. In addition, complex gas manifolds can be fabricated for much lower cost with using three-dimensional metal printing. The cost reduction can, for example, can be three to five times less using three-dimensional metal printing. Also, manufacturing times can be two to three times less than manufacturing times using conventional machining, and 3D Printing can be used in conjunction with machining, welding, brazing and other known manufacturing processes.

Figure 1B:
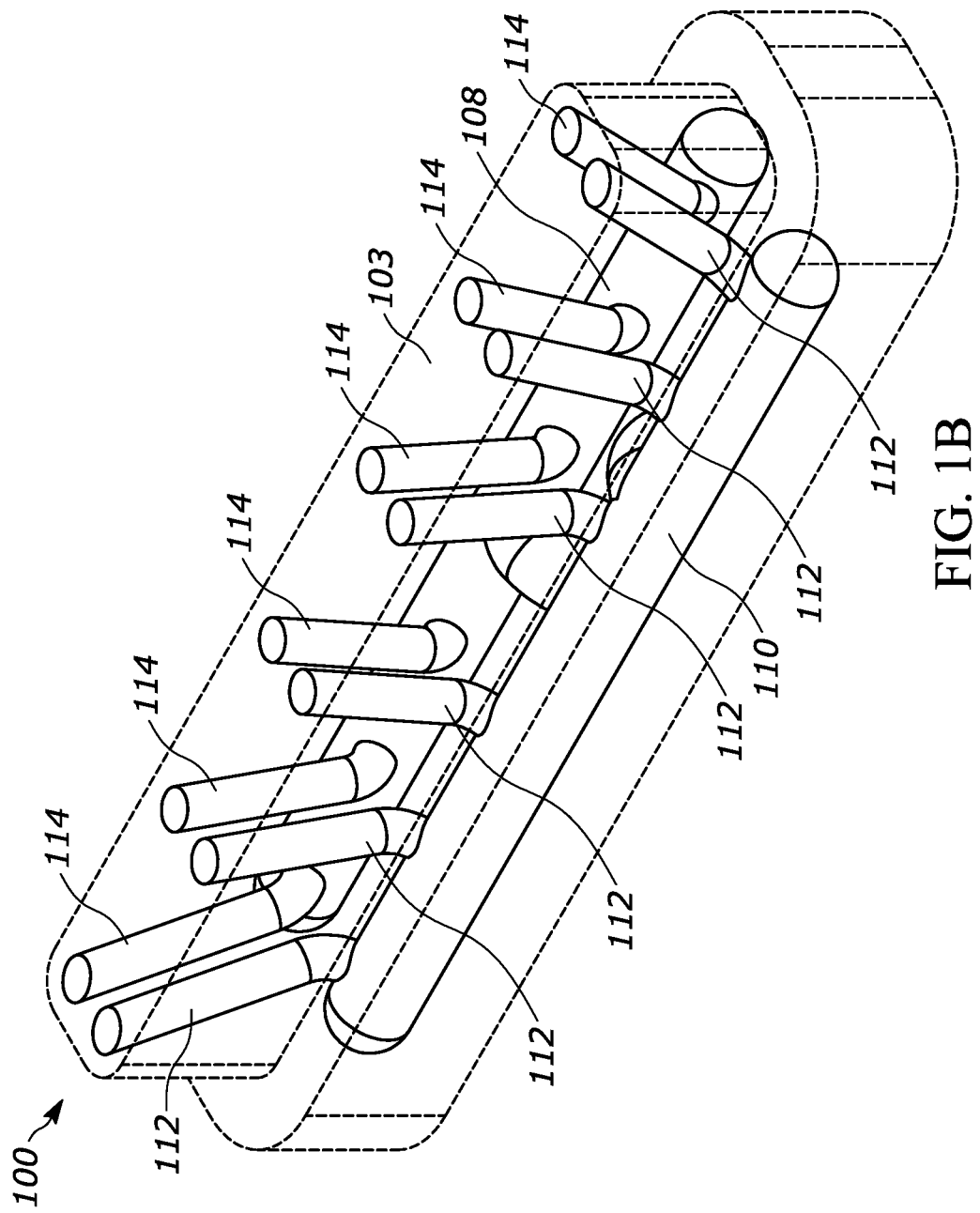
FIG. 1B illustrates a perspective view of a gas manifold according to the present teaching that provides gases from two separate input ports to a plurality of output ports with a precise flow pattern.

FIG. 1A illustrates a cross-sectional view of a gas manifold 100 according to the present teaching that provides gases from two separate input ports to a plurality of output ports with a precise flow pattern. FIG. 1B illustrates a perspective view of the gas manifold 100. The gas manifold 100 includes a first gas input port 104 and a second gas input port 106. The first and second gas input ports 104, 106 are typically coupled to two independent gas sources that supply different gases, such as two different precursor gases for an ALD process and/or a process gas and a purge gas. In various configurations, a first gas valve controls flow of gas entering the first gas input port 104 and a second gas valve controls flow of gas entering the second gas input port 106, wherein the first and second gas valves are independently controllable. Mass flow controllers can also be used to precisely meter the gas into the first gas input port 104 and the second gas input port 106.

The gas manifold 100 also includes a gas outlet surface 103 where gasses passing into the first and second gas input ports 104, 106 and through the gas manifold 100 eventually pass into a process chamber. In various embodiments, the gas outlet surface 103 can have a plurality of different surfaces located at various points within a 3-dimensional profile proximate to one or more substrates within the process chamber.

In some configurations, a separate supply gas manifold provides connections from various gas sources to the first and second gas input ports 104, 106. For example, the separate supply gas manifold can couple one of a plurality of gas sources to one or both of the first and second gas input ports 104, 106. For example, the separate supply gas manifold can supply both a process and a purge gas to one or both of the first and second gas input ports 104, 106. Also, the separate supply gas manifold can supply one of numerous types of process gases to one or both of the first and second gas input ports 104, 106. In various embodiments, the two or more gas conduits may fully or partially merge within the manifold 100 in order to create one or more desired mixed gas molar ratios at one or more points within a 3-dimensional profile. In addition, the separate supply gas manifold can be used to supply multiple process gases to one or both of the first and second gas input ports 104, 106 at the same time.

The first input port 104 is coupled to a first internal chamber 108. The second input port 106 is coupled to a second internal chamber 110 that is physically isolated from the first internal chamber 108. In the embodiment shown in FIG. 1, there are two internal chambers 108, 110 that are isolated from each other so that gasses introduced from the various gas inlets don't mix. Many processes require separate internal chambers because it is essential that process gases don't mix before they reach the growth surface of the substrate. Otherwise, unwanted reactions can occur resulting in contamination and/or poor deposited film quality.

It should be understood that manifolds according to the present teaching can include one or any number of internal chambers and gas input ports depending on the particular desired process conditions and manifold configurations including any additional supply gas manifolds. In the specific configuration shown, the first internal chamber 108 is coupled to the first gas input port 104 and the second internal chamber 110 is coupled to the second gas input port 106.

At least one gas conduit is coupled to each of the first 108 and second internal chamber 110. In the configuration shown, a first plurality of gas conduits 112 is coupled to the first internal chamber 108 and a second plurality of gas conduits 114 is coupled to a second internal chamber 110. Each of the first plurality of gas conduits 112 has an input coupled to the first internal chamber 110 and an outlet at the gas outlet surface 103. In various configurations, the direction of at least two of the conduits in the first plurality of gas conduits 112 relative to the gas outlet surface 103 is different from a direction of another one of the conduits in the first plurality of gas conduits 112 relative to the gas outlet surface 103. In many embodiments, the direction of each of the conduits in the first plurality of gas conduits 112 relative to the gas outlet surface 103 is different from a direction of each of the other conduits in the first plurality of gas conduits 112 relative to the gas outlet surface 103. The directions of each of the conduits in the first plurality of gas conduits 112 relative to the gas outlet surface 103 are generally selected to achieve certain desired gas flow properties at one or more localized points in a profile proximate to the gas outlet surface 103 that define desired gas flow properties at one or more localized points in a 3-dimensional profile within the process chamber, which result in certain desired process results. In some embodiments, the directions of each of the conduits in the first plurality of gas conduits 112 relative to the gas outlet surface 103 is chosen so as to create desired gas flow properties across one or more growth surfaces of a substrate in the process chamber to achieve a desired process result for the substrate.

For example, a desired deposition process result can be to deposit a uniform film on one or more growth surfaces of the substrate. Alternatively, a desired deposition process result can be to deposit a desired non-uniform film with a desired predetermined film deposition profile. Similarly, some desired process results for etching are uniform film etching or desired non-uniform film etching where there is a desired predetermined film etching profile.

The second internal chamber 110 is coupled to the second gas input port 106 so that the second internal chamber 110 is isolated from the first internal chamber 108. In the configuration shown, the second plurality of gas conduits 114 is coupled to the second internal chamber 110. Each of the second plurality of gas conduits 114 has an input coupled to the second internal chamber 110 and an outlet at the gas outlet surface 103. In various configurations, the direction of at least two of the conduits in the second plurality of gas conduits 110 relative to the gas outlet surface 103 is different from a direction of another one of the conduits in the second plurality of gas conduits 110 relative to the gas outlet surface 103.

Similar to the second plurality of gas conduits 110, in many embodiments, the direction of each of the conduits in the second plurality of gas conduits 114 relative to the gas outlet surface 103 is different from a direction of each of the other conduits in the second plurality of gas conduits 114 relative to the gas outlet surface 103. The direction, cross-sectional area, shape, and length of each of the conduits in the second plurality of gas conduits 114 relative to the gas outlet surface 103 are generally selected to achieve desired gas flow properties, such as precise flow patterns, volumetric flow rates, velocities, and pressures at localized points within a 3-dimensional profile proximate to the gas outlet surface 103 that defines desired gas flow patterns in the process chamber and, in particular, a desired gas flow pattern across the grown surface of a substrate in the process chamber.

FIG. 2 shows a gas manifold 200 according to the present teaching where at least one of the plurality of conduits has a different conduit cross sectional area and/or cross-sectional shape. Referring to FIGS. 1A, 1B, and 2, one feature of the gas manifold 200 is that the conduits in the first 112 and/or second plurality of conduits 114 can be made to have any cross-sectional shape and any area. Furthermore, cross-sectional shapes and areas for particular ones of the first 112 and/or second plurality of conduits 114 can be independent of other ones of the first 112 and/or second plurality of conduits 114. Each of the first 112 and/or second plurality of conduits 114 can be made to have a cross-sectional shape and/or area that is different from each of the other of the first 112 and/or second plurality of conduits 114. However, it is easier in some configurations to model desired gas flow patterns in conduits that have regular cross-sectional shapes. For that reason, some embodiments of gas flow manifolds according the present teaching have uniformly circular or rectangular cross-sectional shapes.

Thus, in various embodiments, each of the conduits in the first 112 and/or second plurality of conduits 114 can have the same or different cross-sectional areas. The cross-sectional areas can be chosen to provide different gas flow properties, such as precise flow patterns, volumetric flow rates, velocities, pressures, and mixed gas molar ratios at one or more localized points within a 3-dimensional profile proximate to the gas outlet surface 103 of the manifold 100. For example, the cross-sectional areas of at least some of the conduits in the first plurality of gas conduits 112 and/or the second plurality of gas conduits 114 can be chosen to provide a volumetrically uniform gas flow(s) within a 3-dimension profile proximate to the gas outlet surface 103. Alternatively, the cross-sectional areas of at least some of the conduits in the first plurality of gas conduits 112 and/or the second plurality of gas conduits 114 can be chosen to provide a desired predetermined volumetrically non-uniform gas flow(s) within a 3-dimensional profile proximate to the gas outlet surface 103.

Also, the cross-sectional areas of each of the conduits in the first 112 and/or second plurality of conduits 114 can be chosen to provide different gas flow velocities to different locations on the gas outlet surface 103 of the manifold 100. The different gas flow velocities in the different ones of the first 112 and/or second plurality of conduits 114 provided by the different cross-sectional areas can be used to create uniform gas flow(s) proximate to the gas outlet surface 103. Alternatively, the different gas flow velocities in different ones of the first 112 and/or second plurality of conduits 114 provided by the different cross-sectional areas can be used to create desired predetermined non-uniform gas flow(s) proximate to the gas outlet surface 103. Similarly, the cross-sectional areas of each of the conduits in the first 112 and/or second plurality of conduits 114 can be chosen to provide other different gas parameters, such as different volumetric flow rates, different local gas velocities, and different localized gas pressures.

Figure 3:
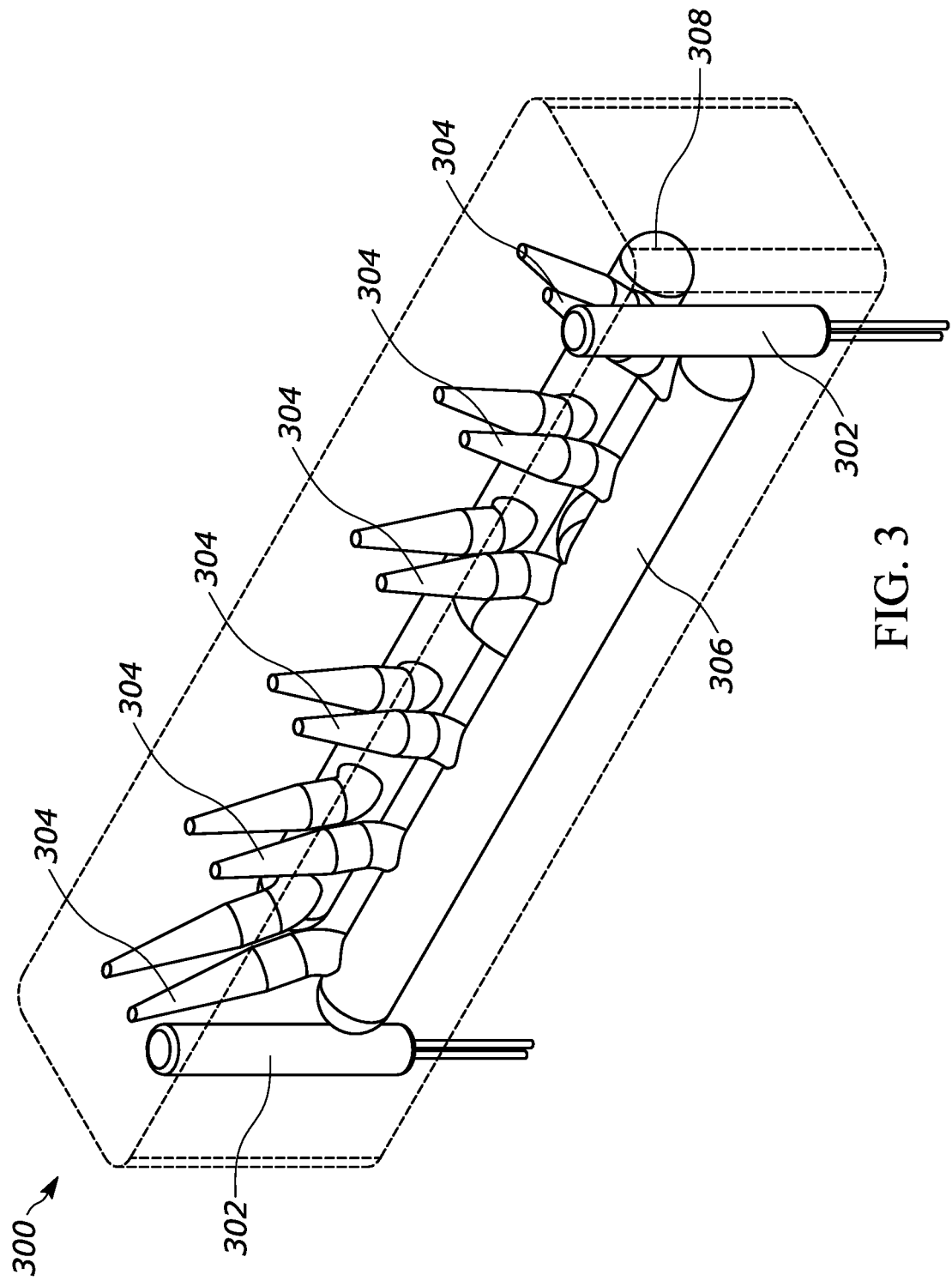
FIG. 3 illustrates a gas manifold according to the present teaching that includes a gas heater for at least one of the plurality of conduits, and where at least one of the plurality of conduits changes in cross-sectional area along the length of its' path.

FIG. 3 illustrates a gas manifold 300 according to the present teaching with at least one gas heater 302 where at least one of the plurality of conduits 304 is formed with a non-uniform cross-sectional area along its length. In some configurations according to the present teaching, it is advantageous to form one or more of the plurality of conduits 304 in the gas manifold 300 with a non-uniform cross-sectional area along its length. There are many possible advantages and/or practical considerations for having at least some of the plurality of conduits have non-uniform cross-sectional area along its length. For example, referring to FIGS. 1A, 1B, and 2, there may be physical size constraints at the gas inlet 104 and/or the gas outlet surface 103 that limit the physical size of the apertures at the gas inlet 104 and/or the gas outlet surface 103. Also, using different cross-sectional area along the length of at least some of the first 112 and/or second plurality of conduits 114 allows more flexibility in the geometry of the gas manifold, and can be used to effect gas flow properties like volumetric flow rates, velocities, temperatures, pressures, and mixed gas molar ratios at one or more localized points within a 3-dimensional profile.

One aspect of the present teaching is that configuring the manifold according to the present teaching with one or more of the conduits in the first 112 and/or second plurality of conduits 114 having a different cross-sectional area can provide a desired process or purge gas flow pattern proximate to the gas outlet surface 103. Such a desired process or purge gas flow pattern can be used to define the desired gas flow patterns in the process chamber and especially, the desired gas flow patterns proximate to growth surfaces in one or more substrates in the process chamber that is used for deposition and etching. This feature of providing gas conduits with customizable cross-sectional areas allows manufacturers to provide a customized gas manifold for a particular process chamber geometry. Such a feature can also be used to allow manufacturers to provide a customized gas manifold for a particular process that is performed in a process chamber with a particular process chamber geometry.

The low cost of three-dimensional metal printing is such that it could be economically practical for a manufacturer to provide many gas manifolds for a processing system where each manifold is customized for one particular process and/or substrate. Furthermore, the manufacturer can provide modeling software to the user so that they can design their own manifolds for their specific processes, where the users would then provide the completed models to the manufacturers for fabrication. Such a feature can create an ongoing consumable market for the manufacturer.

The gas manifold 300 shown in FIG. 3 also includes a gas heater 302 for at least one of the plurality of conduits 304. Gas heaters 302 can be integrated into one or both of the first 306 and second internal chamber 308. One advantage of constructing gas manifolds using three dimensional printing according to the present teaching is that it is relatively easy to construct a manifold with built-in heating elements positioned proximate to one or more of a plurality of conduits. Such heating elements can be used to independently control the temperature of specific gas conduits. Thermally insulating materials and/or structures can be formed in the gas manifold to thermally isolate or expose individual gas conduits as needed. At least one temperature controller can then be used to control a temperature of gas in at least one of the plurality of gas conduits.

Figure 4A:
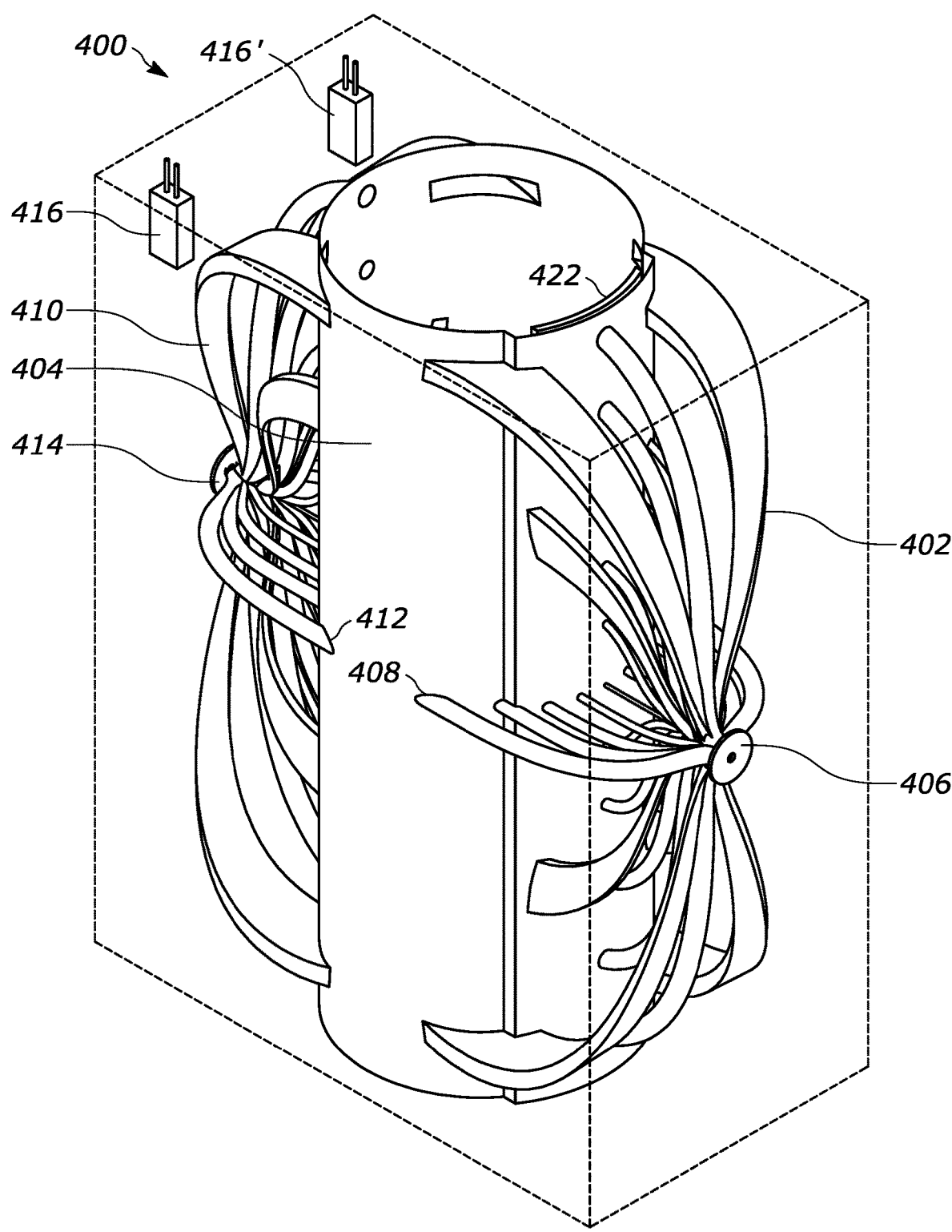
FIG. 4A illustrates a perspective view of an integrated gas manifold according to the present teaching.
Figure 4B:
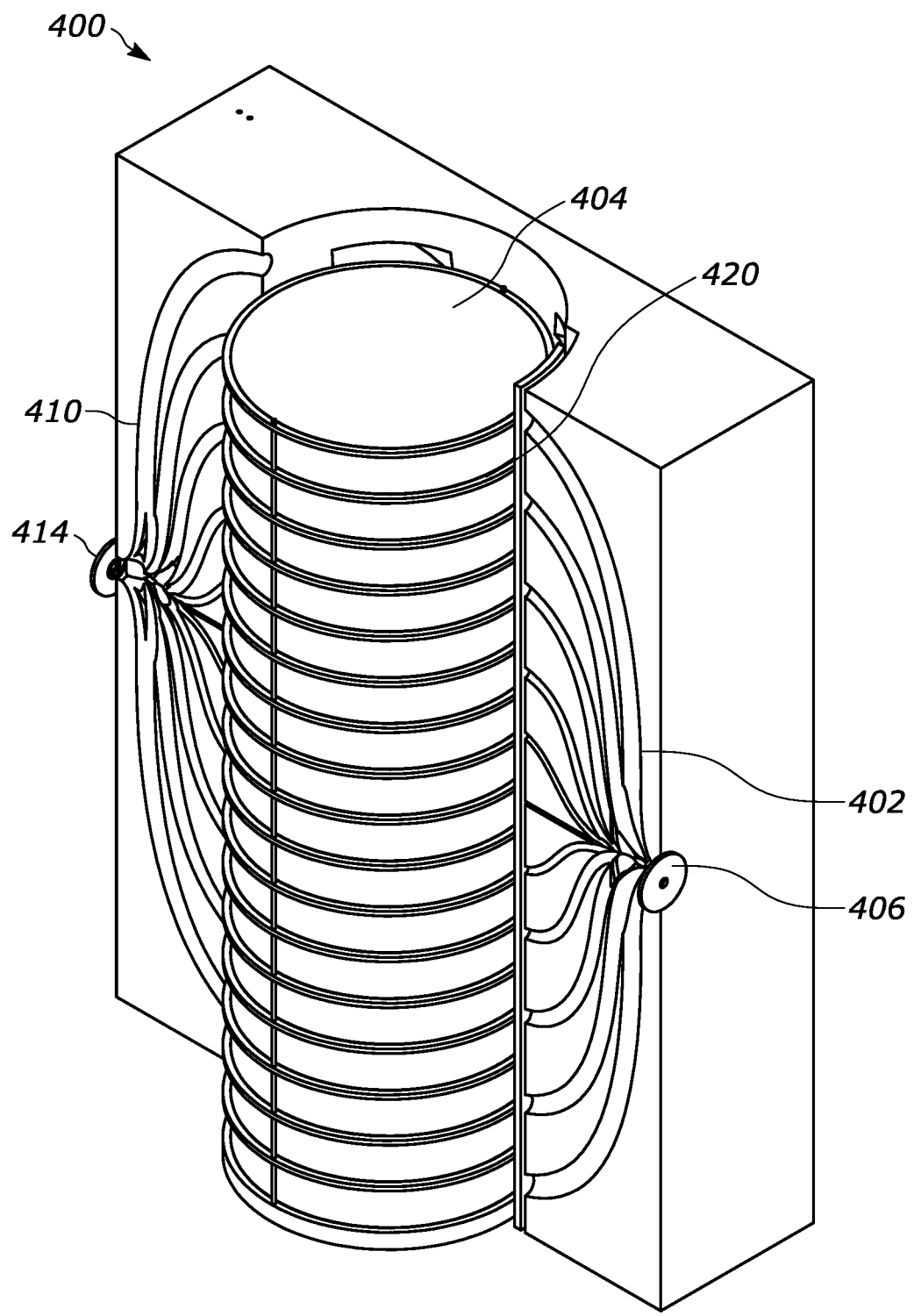
FIG. 4B illustrates a perspective cross-sectional view of the reactor with the integrated gas manifold that shows inside details of the reaction chamber.
Figure 4C:
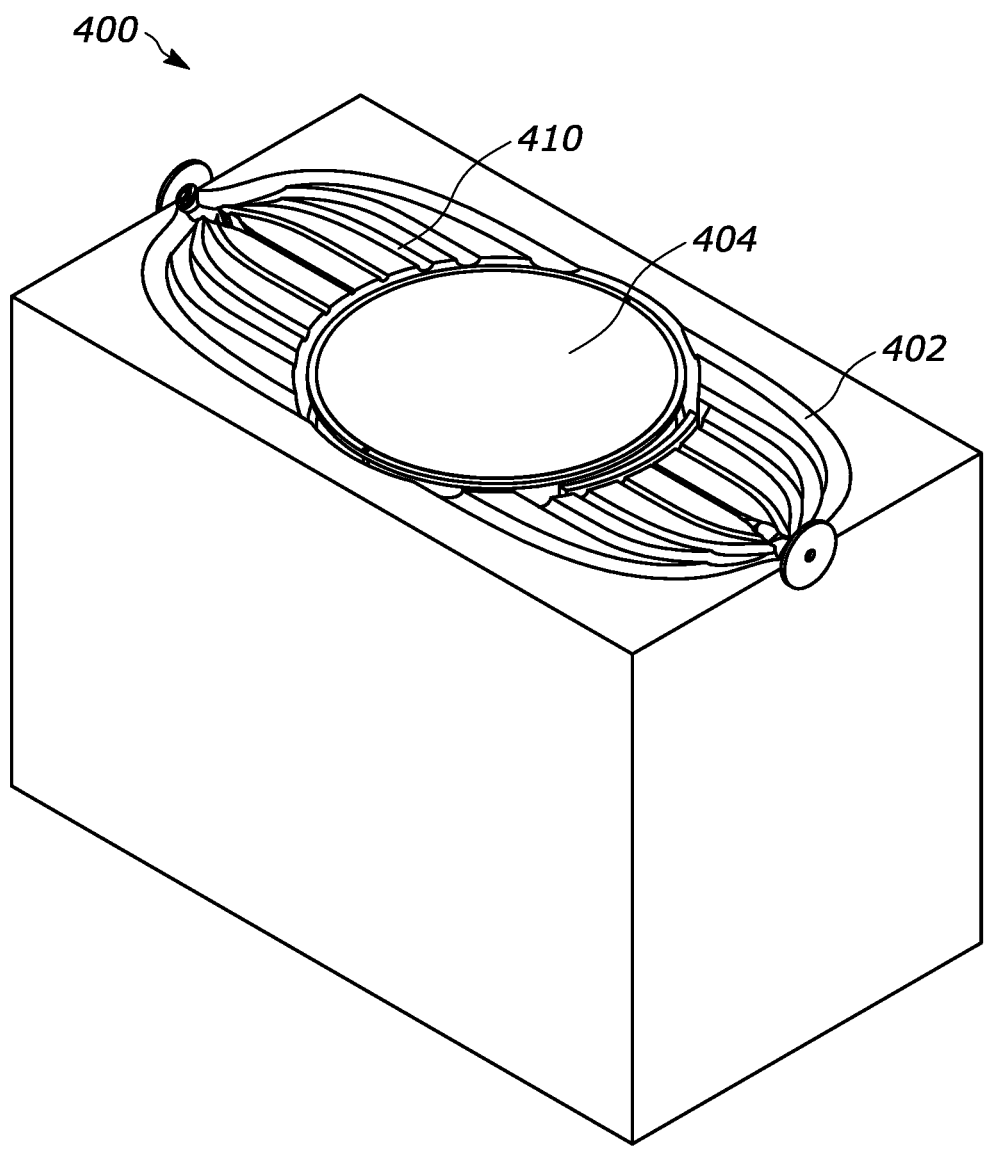
FIG. 4C illustrates a top perspective view perspective cross-sectional view of the reactor with the integrated first and second gas manifold and reaction chamber.

FIGS. 4A-C illustrates various views of a reactor 400 with an integrated gas manifold 402 according to the present teaching. FIG. 4A illustrates a perspective view of an integrated gas manifold 402 according to the present teaching. The term integrated gas manifold is used herein to mean that the gas manifold is formed within the system. The reactor 400 includes a reaction chamber 404, which is described in more detail in connection with FIG. 4B.

The first gas manifold 402 includes an input port 406 that receives process gases and a plurality of output ports 408 that are coupled to the reactor 400. A second manifold 410 includes a plurality of ports 412 coupled to the reaction chamber 404 and a port 414. As with the first gas manifold 402, the second manifold 410 can be formed in almost any shape and formed in almost any cross section with little incremental cost to manufacture giving system designers a high degree of flexibility. In the specific embodiment shown, the first gas manifold 402 and the second manifold 410 are matching manifolds.

One feature of the present teaching is that the integrated gas manifold 402 can be formed in almost any shape and formed with almost any cross section with little incremental cost to manufacture giving system designers a high degree of flexibility. For example, a direction of at least two of the conduits in the first 402 or the second gas manifold 410 relative to the gas outlet surface 103 (FIGS. 1A and 1B) can be different from a direction of another one of the at least two of the conduits in the first 402 or the second gas manifold 410 relative to the gas outlet surface 103.

Also, as described in connection with the manifold 100 of FIG. 1, a cross-sectional area of at least one of the gas conduits in the first gas manifold 402 can be different from a cross-sectional area of another one of the gas conduits in the first gas manifold 402. Similarly, a cross-sectional area of at least one of the gas conduits in the second gas manifold 410 can be different from a cross-sectional area of another one of the gas conduits in the second gas manifold 410. In addition, the cross-sectional shape of at least one of the gas conduits in the first gas manifold 402 can different from a cross-sectional shape of another one of the gas conduits in the first gas manifold 402. Similarly, a cross-sectional shape of at least one of the gas conduits in the second gas manifold 410 can be different from a cross-sectional shape of another one of the gas conduits in the second gas manifold 410.

In some configurations, the combination of the directions of each of the gas conduits in the first and second 402, 410 gas manifolds relative to their respective gas outlet surface in addition to the cross sectional shape and area of each of the plurality of gas conduits is chosen so that there is a desired gas flow pattern proximate to the substrate support for the particular process being performed. Such a desired gas flow pattern will provide the desired conditions at the growth surface of the substrate(s) to achieve the desired process results.

The second manifold 410 is typically an exhaust gas manifold that removes gas injected by the first gas manifold 402 and any process gases and by-products produced during the processing. In embodiments where the second manifold 410 is an exhaust manifold, the port 414 is coupled to a vacuum system (not shown) that removes process gases and by-product gases. Process gases will flow from the conduits in the first gas manifold 410 over a surface of the substrate support to the conduits in the second gas manifold 414. In embodiments where the second manifold 410 is a gas manifold, the manifold can be used, for example, to provide purge gases. In some configurations, process and purge gases can be removed at the top and bottom of the process chamber with a vacuum system (not shown).

The gas manifold 402 also includes two electrodes 416, 416' that can be electrically powered to provide an electrical field proximal to one or more conduits within the manifold in order to ionize gas at one or more localized points within a 3-dimensional profile.

FIG. 4B illustrates a perspective cross-sectional view of the reactor 400 with the integrated gas manifold 402 that shows inside details of the reaction chamber 404. In various embodiments, the reaction chamber 404 includes substrate supports 420 that can be a single substrate support and/or a multi-substrate support as shown. The multi-substrate support can support multiple substrates in a horizontal or a vertical position. Typically, the reactor 400 includes an airlock (not shown) for loading substrates on the substrate support 406. For example, the airlock can be a side-loading airlock, a top-loading airlock, or a front-loading airlock.

Some configurations use a gas baffle 422 that is positioned in the reaction chamber 404. The gas baffle and can be configured to provide a desired gas flow pattern proximate to the substrate support. The gas baffle can be configured to increase a process or purge gas pressure at a point proximate to the surface of the substrate support.

FIG. 4C illustrates a top perspective view perspective cross-sectional view of the reactor 450 with the integrated first 402 and second gas manifold 410 and reaction chamber 404.

EQUIVALENTS

While the applicant's teaching is described in conjunction with various embodiments, it is not intended that the applicant's teaching be limited to such embodiments. On the contrary, the applicant's teaching encompass various alternatives, modifications, and equivalents, as will be appreciated by those of skill in the art, which may be made therein without departing from the spirit and scope of the teaching.

What is claimed is:

1. A gas manifold comprising:
   a) a gas inlet surface comprising a first gas input port and a second gas input port;
   b) a gas outlet surface;
   c) a first internal chamber coupled to the first gas input port;
   d) a first plurality of gas conduits, each of the first plurality of gas conduits having an input coupled to the first internal chamber and an outlet at the gas outlet surface, wherein a direction of at least one of the first plurality of gas conduits relative to the gas outlet surface is different from a direction of another one of the first plurality of gas conduits relative to the gas outlet surface, wherein a cross-sectional area of the at least one of the conduits in the first plurality of gas conduits is different from a cross-sectional area of another one of the conduits in the first plurality of gas conduits, and wherein a cross-sectional shape of the at least one of the first plurality of gas conduits is different from a cross-sectional shape of another one of the first plurality of gas conduits;
   e) a second internal chamber coupled to the second gas input port, wherein the second internal chamber is isolated from the first internal chamber; and
   f) a second plurality of gas conduits, each of the second plurality of gas conduits having an input coupled to the second internal chamber and an outlet at the gas outlet surface, wherein a direction of at least one of the second plurality of gas conduits relative to the gas outlet surface is different from a direction of another one of the second plurality of gas conduits relative to the gas outlet surface.

2. The gas manifold of claim 1, wherein a direction of each of the first plurality of gas conduits relative to the gas outlet surface is different from a direction of each of the other of the first plurality of gas conduits relative to the gas outlet surface.

3. The gas manifold of claim 2, wherein a direction of each of the second plurality of gas conduits relative to the gas outlet surface is different from a direction of each of the other of the second plurality of gas conduits relative to the gas outlet surface.

4. The gas manifold of claim 1, wherein a cross-sectional shape of the at least one of the second plurality of gas conduits is different from a cross-sectional shape of another one of the second plurality of gas conduits.

5. The gas manifold of claim 1, wherein at least some of the first and second plurality of gas conduits are intersected in a way that provides a desired volumetric gas flow pattern proximate to the gas outlet surface.

6. The gas manifold of claim 1, wherein at least one of the first and second plurality of gas conduits is formed with a non-uniform cross-sectional area along a longitudinal length.

7. The gas manifold of claim 1, wherein at least one of the first and second plurality of conduits is configured to have a resultant volumetric gas flow pattern proximate to the gas outlet surface to be a uniform distribution of gas or a non-uniform distribution of gas.

8. The gas manifold of claim 1, wherein the gas manifold is an atomic layer deposition gas manifold.

9. The gas manifold of claim 1, wherein the gas manifold is a molecular layer deposition gas manifold.

10. The gas manifold of claim 1, wherein the gas manifold is a chemical vapor deposition gas manifold.

11. The gas manifold of claim 1, further comprising at least one temperature controller that controls a temperature of gas in at least one of the first and second plurality of gas conduits.

12. The gas manifold of claim 1, wherein a cross-sectional area of at least two of the conduits in the first plurality of gas conduits is the same.

* * * * *